(12) United States Patent
Ato

(10) Patent No.: US 6,439,962 B1
(45) Date of Patent: Aug. 27, 2002

(54) CLEANING APPARATUS

(75) Inventor: Koji Ato, Kawasaki (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/238,612

(22) Filed: Jan. 28, 1999

(30) Foreign Application Priority Data

Jan. 30, 1998 (JP) .......................................... 10-034347

(51) Int. Cl.[7] .............................................. B24B 49/12
(52) U.S. Cl. ............................................ 451/6; 451/67
(58) Field of Search .............................. 451/6, 41, 44, 451/65, 5, 67, 73

(56) References Cited

U.S. PATENT DOCUMENTS

| | | | | |
|---|---|---|---|---|
| 4,197,679 A | * | 4/1980 | Yamada et al. ............. | 451/251 |
| 5,074,079 A | * | 12/1991 | Park ............................ | 451/43 |
| 5,468,302 A | * | 11/1995 | Thietje ......................... | 134/1 |
| 5,518,542 A | * | 5/1996 | Matsukawa et al. .......... | 118/52 |
| 5,655,954 A | * | 8/1997 | Oishi et al. ................... | 451/67 |
| 5,725,414 A | * | 3/1998 | Moinpour et al. ............ | 451/44 |
| 6,113,463 A | * | 5/2000 | Hasegawa et al. ............. | 451/6 |

FOREIGN PATENT DOCUMENTS

JP          60-80241          8/1985

* cited by examiner

Primary Examiner—Robert A. Rose
(74) Attorney, Agent, or Firm—Wenderoth, Lind & Ponack, L.L.P.

(57) ABSTRACT

An apparatus performs at least one of cleaning and drying a semiconductor wafer while rotating the semiconductor wafer. The apparatus has a rotating mechanism for rotating the semiconductor wafer, and a sensor for detecting a reference position such as a notch or an orientation flat of the semiconductor wafer. The semiconductor wafer may be stopped from rotating to align the reference position with a predetermined position based on an output signal from the sensor.

36 Claims, 4 Drawing Sheets

F I G. 3A
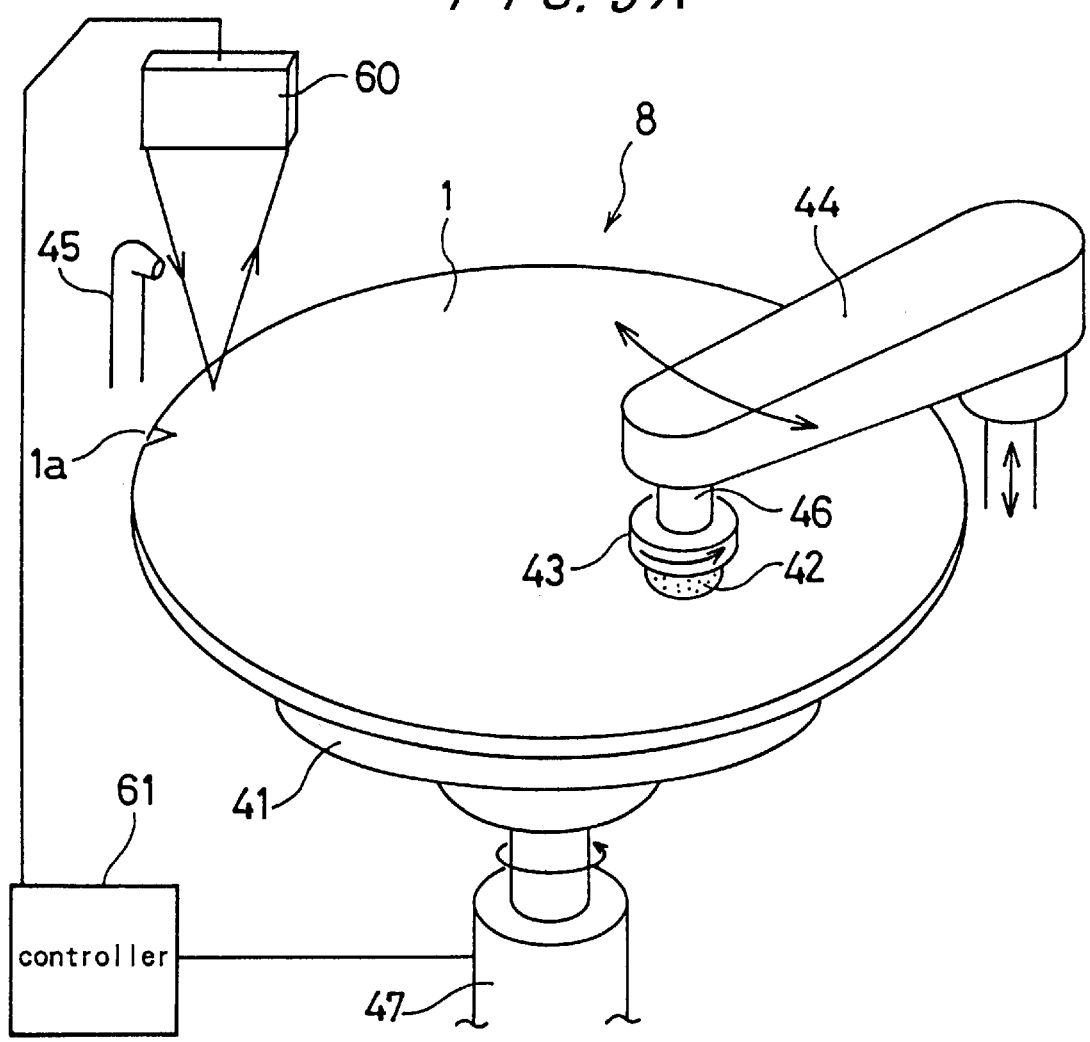
F I G. 3B
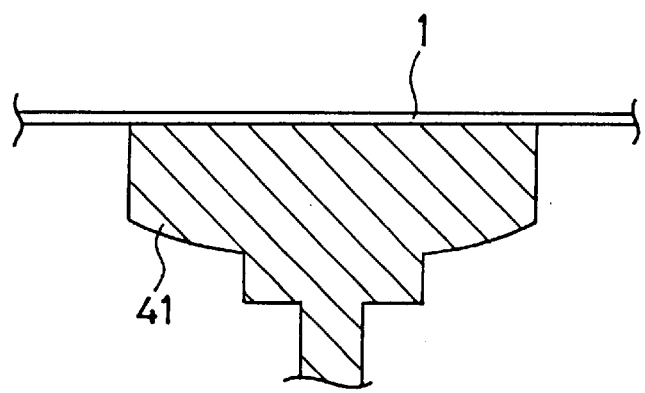

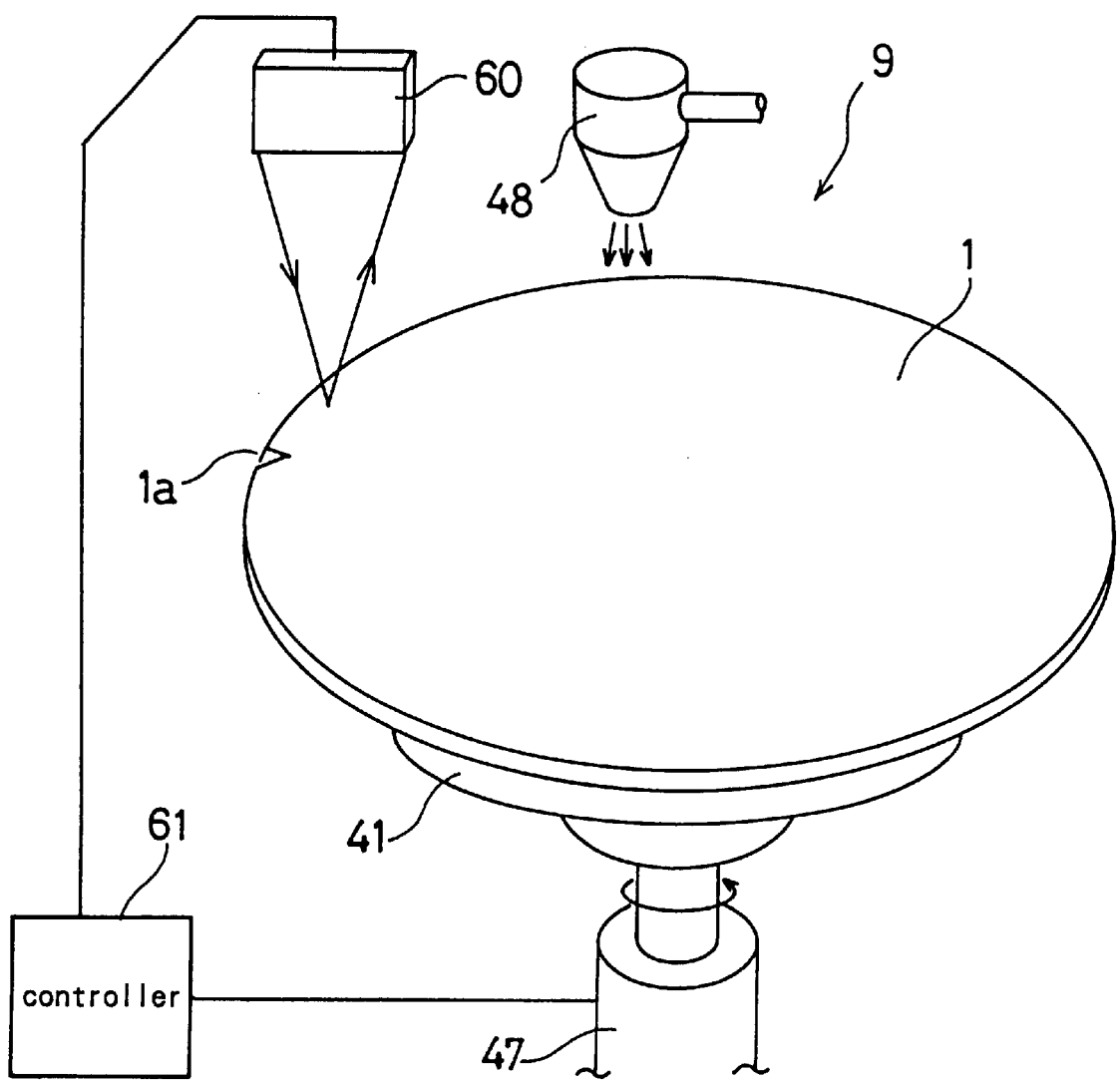
F I G. 4

CLEANING APPARATUS

BACKGROUND OF THE INVENTION

1. Field of the Invention

The present invention relates to a cleaning apparatus for cleaning a semiconductor wafer, and more particularly to a cleaning apparatus for cleaning a semiconductor wafer that needs to have a high degree of cleanness.

2. Description of the Related Art:

As semiconductor devices have become more highly integrated in recent years, circuit interconnections on semiconductor substrates become finer and distances between such circuit interconnections become smaller. When semiconductor wafers are processed, fine particles such as particles of semiconductor material, dust particles, crystalline protrusive particles, or the like often tend to be attached to the semiconductor wafers being processed. If a particle greater in size than the distance between interconnections exists on a semiconductor substrate, then the particle will short-circuit interconnections on the semiconductor substrate. Therefore, any undesirable particles on a semiconductor substrate have to be sufficiently smaller than the distance between interconnections on the semiconductor substrate. Such a problem and a requirement hold true for the processing of other substrates including a glass substrate to be used as a mask, a liquid crystal panel, and so on. To meet the above requirement, there have been practiced various cleaning procedures for removing fine particles or submicron particles from semiconductor wafers.

For example, as a cleaning method for cleaning a semiconductor wafer which has been polished, there has heretofore been one practice to use a brush of nylon, mohair or the like, or a sponge of polyvinyl alcohol (PVA) to scrub a surface of a semiconductor wafer. This process is called a scrubbing cleaning process. Further, there have been other practices, one of which is an ultrasonic cleaning process in which water having ultrasonic vibrational energy applied thereto is supplied to a surface of a semiconductor wafer, the other of which is a cavitation jet cleaning process in which high pressure water generating cavitation is supplied to a surface of a semiconductor wafer. Also, a cleaning process which combines two or three of the above processes is known in the art. In addition, a cleaning process may be combined with a spin drying process in which a cleaned semiconductor wafer is rotated at a high speed to remove under centrifugal forces any cleaning liquid such as water that has remained on the surface of the semiconductor wafer from the cleaning process.

The above conventional cleaning apparatuses which are designed to carry out the above scrubbing process or any other cleaning process combined with the spin drying process do not have a mechanism for detecting a reference position on a semiconductor wafer, which may be represented by an orientation flat or a notch, and stopping the semiconductor wafer at a predetermined position. Therefore, if a need arises for aligning the reference position on a semiconductor wafer with a certain direction after the semiconductor wafer has been cleaned, then an additional device for achieving such positional alignment of the semiconductor wafer is required.

Further, the conventional cleaning apparatuses do not directly detect the rotational speed of a semiconductor wafer upon rotation thereof, but indirectly detect it by detecting the rotational speed of a drive power source or a drive shaft by which the semiconductor wafer is rotated. Consequently, the conventional cleaning apparatuses fail to detect a rotation failure or a rotation abnormality of the semiconductor wafer which is caused by wear or other troubles of a component of a power transmitting mechanism which is interposed between the drive power source and the semiconductor wafer.

SUMMARY OF THE INVENTION

It is therefore an object of the present invention to provide a cleaning apparatus for carrying out a scrubbing process, a spin drying process, or the like which has a sensor for detecting a reference position on a semiconductor wafer, which may be represented by an orientation flat or a notch, and a function for stopping the semiconductor wafer whose reference position is aligned with a given direction and/or a function for directly detecting the rotational speed of the semiconductor wafer.

In order to achieve the above object, according to one aspect of the present invention, there is provided an apparatus for performing at least one of cleaning and drying a semiconductor wafer while rotating the semiconductor wafer, comprising: a rotating mechanism for rotating the semiconductor wafer; a sensor for detecting a reference position of the semiconductor wafer.

According to another aspect of the present invention, there is also provided a polishing apparatus for polishing a semiconductor wafer, comprising: a polishing section for polishing a surface of the semiconductor wafer; and a cleaning apparatus for cleaning the polished surface of the semiconductor wafer, the cleaning apparatus comprising: a rotating mechanism for rotating the semiconductor wafer; and a sensor for detecting a reference position of the semiconductor wafer.

According to the present invention, based on the detection of the reference position of the semiconductor wafer during rotation of the semiconductor wafer, it is possible to detect the rotational speed of the semiconductor, and to stop the semiconductor wafer from rotating to align the reference position with a predetermined position.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIG. 3A is a perspective view of a cleaning apparatus according to a second embodiment of the present invention;

FIG. 3B is a fragmentary vertical cross-sectional view of the cleaning apparatus shown in FIG. 3A; and FIG. 4 is a perspective view of a cleaning apparatus according to a third embodiment of the present invention.

DETAILED DESCRIPTION OF THE PREFERRED EMBODIMENTS

Figure 1:
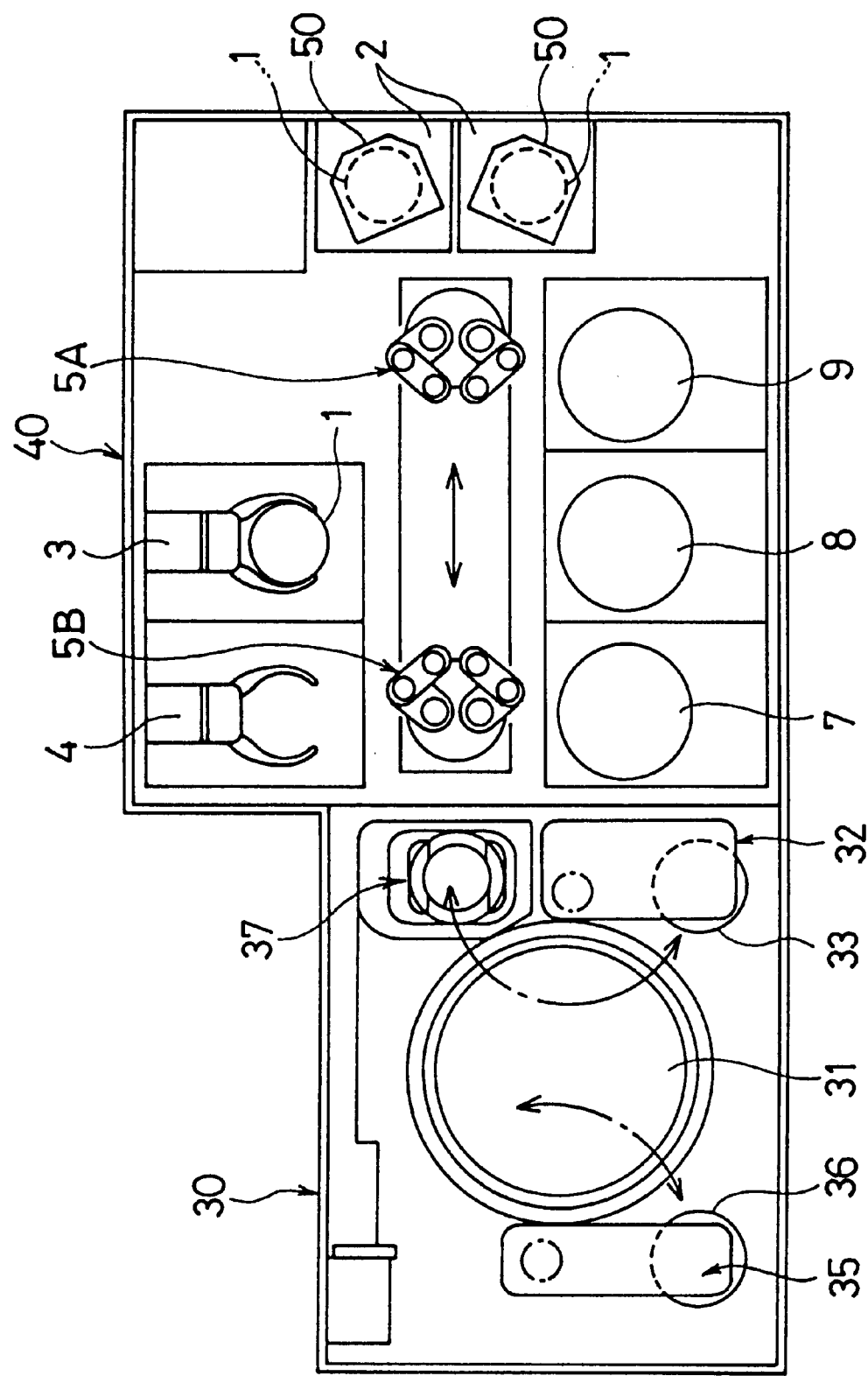
FIG. 1 is a schematic plan view of a polishing apparatus which incorporates a cleaning apparatus according to the present invention.

Like or corresponding parts are denoted by like or corresponding reference numerals throughout views.

The principles of the present invention are particularly useful when incorporated in a cleaning apparatus for cleaning semiconductor wafers which have been polished by a polishing apparatus.

In a polishing process carried out by such a polishing apparatus, a semiconductor wafer is polished to a flat mirror surface while it is being supplied with an abrasive liquid containing abrasive grains. Therefore, immediately after the semiconductor wafer has been polished, the polished surface of the semiconductor wafer is contaminated with the abrasive liquid containing abrasive grains and ground-off particles of the semiconductor wafer. According to the present invention, the semiconductor wafer that has been polished is cleaned by a plurality of successive cleaning steps to remove those contaminants from the polished surface of the semiconductor wafer.

FIG. 1 is a plan view showing a polishing apparatus which incorporates a cleaning apparatus according to the present invention. As shown in FIG. 1, the polishing apparatus generally comprises a polishing section 30 for polishing semiconductor wafers 1 and a cleaning section 40 for cleaning semiconductor wafers 1 that have been polished by the polishing section 30. The polishing section 30 and the cleaning section 40 are joined to each other.

The polishing section 30 comprises a turntable 31 disposed in a central position therein, a top ring unit 32 disposed on one side of the turntable 31 and having a top ring 33 for holding a semiconductor wafer 1, a dressing unit 35 disposed on an opposite side of the turntable 31 and having a dressing tool 36 for dressing a polishing cloth attached to the upper surface of the turntable 31, and a wafer transfer unit 37 disposed adjacent to the top ring unit 32.

The cleaning section 40 comprises a loading/unloading stage 2 for loading semiconductor wafers 1 to be processed and unloading semiconductor wafers 1 which have been processed, a dry wafer reversing unit 3 and a wet wafer reversing unit 4 for reversing, i.e., turning upside down, semiconductor wafers 1, a pair of transfer units 5A, 5B for transferring semiconductor wafers 1, and three cleaning machines, i.e., a primary cleaning machine 7, a secondary cleaning machine 8 and a tertiary cleaning machine 9.

Figure 2:
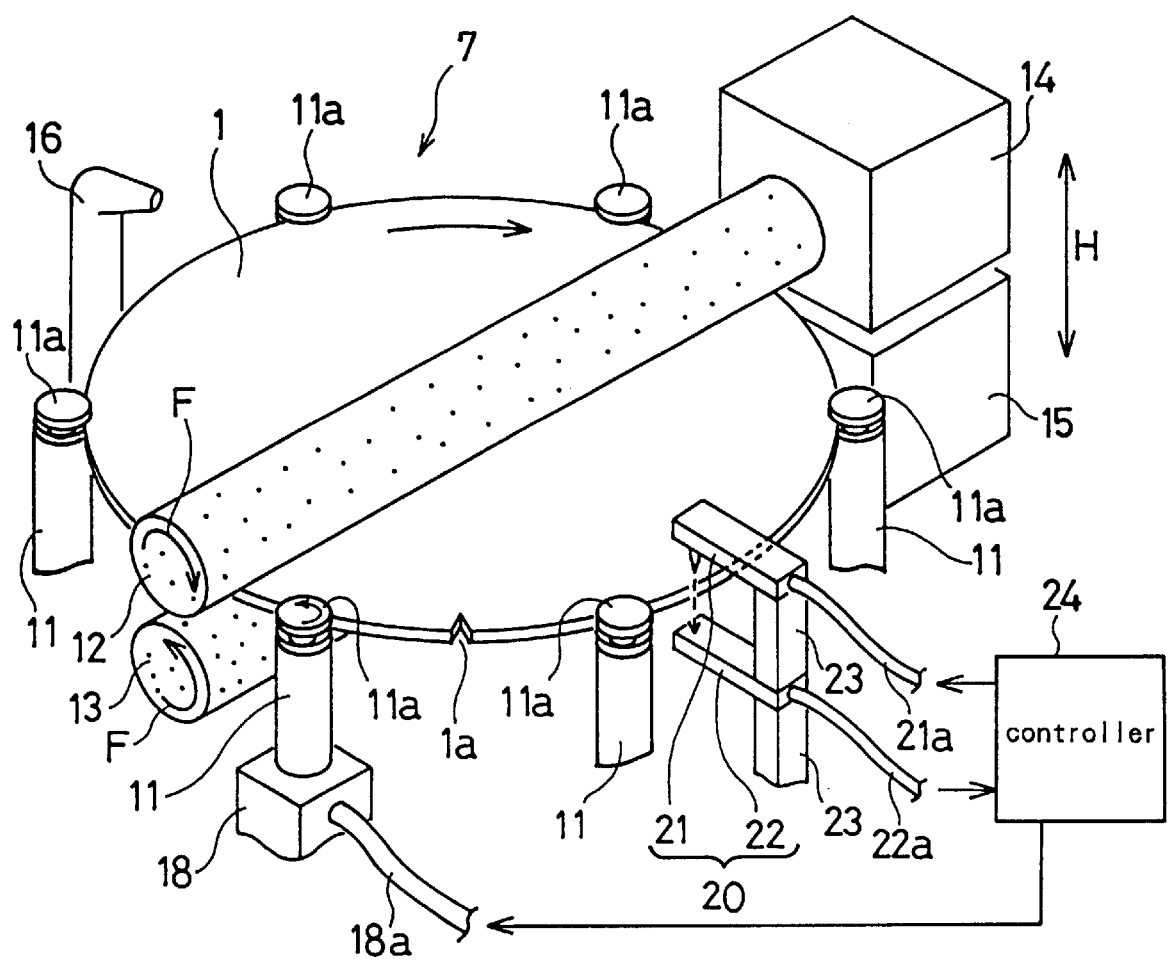
FIG. 2 is a perspective view of a cleaning apparatus according to a first embodiment of the present invention.

The primary cleaning machine 7 serves to clean, for the first time, a semiconductor wafer 1 which has been polished by the polishing section 30. Specifically, while holding and rotating the semiconductor wafer 1, the first cleaning machine 7 applies a cleaning liquid to both surfaces of the semiconductor wafer 1 and holds two cleaning members respectively against the surfaces of the semiconductor wafer 1, thereby cleaning both surfaces of the semiconductor wafer 1. Specific structural details of the first cleaning machine 7 for performing the first cleaning process are shown in FIG. 2.

The secondary cleaning machine 8 serves to clean, for the second time, a semiconductor wafer 1 which has been cleaned by the primary cleaning machine 7. Specifically, while holding and rotating the semiconductor wafer 1, the secondary cleaning machine 8 applies a cleaning liquid to a surface of the semiconductor wafer 1 and holds a cleaning member against the surface of the semiconductor wafer 1, thereby cleaning the polished surface of the semiconductor wafer 1. Specific structural details of the secondary cleaning machine 8 for performing the secondary cleaning process are shown in FIGS. 3A and 3B.

The tertiary cleaning machine 9 serves to finally clean and dry a semiconductor wafer 1 which has been cleaned by the secondary cleaning machine 8. Specifically, while holding and rotating the semiconductor wafer 1, the tertiary cleaning machine 9 ejects a cleaning liquid to the polished surface of the semiconductor wafer 1 to clean the polished surface of the semiconductor wafer 1, then stops supplying the cleaning liquid, and spins the semiconductor wafer 1 to remove the cleaning liquid from the surfaces of the semiconductor wafer 1 under centrifugal forces to thereby dry the surfaces of the semiconductor wafer 1. Specific structural details of the tertiary cleaning machine 9 for performing the final cleaning process and the drying process are shown in FIG. 4.

In the polishing apparatus shown in FIG. 1, when a wafer cassette 50 containing semiconductor wafers 1 to be polished is set on the loading/unloading stage 2, the transfer unit 5A takes one of the semiconductor wafers 1 out of the wafer cassette 50 and transfers the semiconductor wafer 1 to the dry wafer reversing unit 3, which reverses the semiconductor wafer 1. Then, the transfer unit 5B receives the reversed semiconductor wafer 1 from the dry wafer reversing unit 3 and places the semiconductor wafer 1 on the wafer transfer unit 37. The semiconductor wafer 1 is transferred from the wafer transfer unit 37 to the top ring 33 which has been displaced to a position above the wafer transfer unit 37. The top ring 33 holds the semiconductor wafer 1 under vacuum, moves to a position above the turntable 31, and presses the semiconductor wafer 1 against the polishing cloth on the surface of the turntable 31. The lower surface of the semiconductor wafer 1 is polished by the polishing cloth while the turntable 31 and the top ring 33 are rotating independently of each other. Simultaneously, an abrasive liquid is being supplied to the polishing cloth. After the lower surface of the semiconductor wafer 1 has been polished, the top ring 33 moves back to the position above the wafer transfer unit 37, and transfers the polished semiconductor wafer 1 to the wafer transfer unit 37.

The semiconductor wafer 1 on the wafer transfer unit 37 is then transferred by the transfer unit 5B to the wet wafer reversing unit 4, which reverses the semiconductor wafer 1. Thereafter, the semiconductor wafer 1 is delivered successively to the primary, secondary and tertiary cleaning machines 7, 8 and 9 by the transfer units 5A, 5B. The semiconductor wafer 1 is cleaned by the primary and secondary cleaning machines 7, 8, and then cleaned and dried by the tertiary cleaning machine 9. Then, the cleaned and dried semiconductor wafer 1 is returned by the transfer unit 5A to the wafer cassette 50 on the loading/unloading stage 2.

FIG. 2 shows in perspective structural details of the primary cleaning machine 7. As shown in FIG. 2, the primary cleaning machine 7 includes six vertical spindles 11 that are arranged at spaced intervals along a circle for supporting the outer circumferential edge of a semiconductor wafer 1 and rotating the semiconductor wafer 1 in a horizontal plane at a predetermined rotational speed, and a pair of straight cleaning arms 12, 13 made of sponge, PVA, or the like and extending horizontally diametrically above and below the semiconductor wafer 1. The primary cleaning machine 7 further includes a pair of arm actuating mechanisms 14, 15 connected to respective ends of the cleaning arms 12, 13 for vertically moving the cleaning arms 12, 13 in directions indicated by the arrow H and rotating the cleaning arms 12, 13 about their respective axes as indicated by the arrows F, and a pair of cleaning liquid nozzles 16 disposed radially outwardly of the circular pattern of the vertical spindles 11 for supplying a cleaning liquid such as ultrapure water to upper and lower surfaces of the semiconductor wafer 1. In FIG. 2, although only one cleaning nozzle 16 for supplying a cleaning liquid to the upper surface of the semiconductor wafer is shown, another cleaning nozzle 16 is provided to supply a cleaning liquid to the lower surface of the semiconductor wafer 1. The semiconductor wafer 1 is of a circular shape and has a V-shaped notch 1a formed in the outer circumferential edge thereof as representing a reference position of the semiconductor wafer 1.

The vertical spindles 11 have respective retainers 11a on upper ends thereof which are capable of engaging the outer circumferential edge of the semiconductor wafer 1. The vertical spindles 11 are divided into two groups of three spindles 11 positioned on one side of the cleaning arms 12, 13 and other three spindles 11 positioned on the other side of the cleaning arms 12, 13. The two groups of the spindles 11 are movable horizontally toward each other to cause the retainers 11a to engage and hold the outer circumferential edge of the semiconductor wafer 1, and also movable horizontally away from each other to disengage and release the outer circumferential edge of the semiconductor wafer 1. The three spindles 11 of one of the two groups of the spindles 11 include a spindle 11 positioned adjacent to the cleaning arms 12, 13 and coupled to a spindle rotating mechanism 18 having a servomotor (not shown). only this spindle 11 is driven by the spindle rotating mechanism 18 and is rotated. The spindle rotating mechanism 18 is electrically connected to a controller 24 by a wire 18a.

The primary cleaning machine 7 also has a photosensor 20 positioned radially outwardly of the circular pattern of the vertical spindles 11 for detecting the notch 1a formed in the outer circumferential edge of the semiconductor wafer 1. The photosensor 20, which is of the transmissive type, comprises a light-emitting element 21 positioned above the outer circumferential edge of the semiconductor wafer 1 for emitting light downwardly toward the semiconductor wafer 1 and a light-detecting element 22 positioned below the outer circumferential edge of the semiconductor wafer 1 for detecting the light emitted from the light-emitting element 21 and transmitted across the semiconductor wafer 1. The light-emitting element 21 and the light-detecting element 22 are supported on a vertical holder 23. The light-emitting element 21 and the light-detecting element 22 are electrically connected to the controller 24 by respective signal wires 21a, 22a.

In the structure shown in FIG. 2, when the cleaning arms 12, 13 are retracted upwardly and downwardly away from each other by the respective arm actuating mechanisms 14, 15 and also when the two groups of the spindles 11 are moved horizontally away from each other, a semiconductor wafer 1 is transferred by a hand of the transfer unit 5A or 5B from a position diametrically opposite to the arm actuating mechanisms 14, 15 longitudinally along the cleaning arms 12, 13 to a position above the circular pattern of spindles 11. Then, the hand of the transfer unit 5A or 5SB is lowered to place the outer circumferential edge of the semiconductor wafer 1 onto shoulders of the retainers 11a. Then, the two groups of the spindles 11 are moved toward each other into the position shown in FIG. 2 until the retainers 11a hold the outer circumferential edge of the semiconductor wafer 1 which has been lowered. Thereafter, the hand of the transfer unit 5A or 5B is retracted away from the primary cleaning machine 7.

The spindle rotating mechanism 18 is operated to cause the spindle 11 coupled thereto to be rotate and thus to rotate the semiconductor wafer 1 about its own axis. The arm actuating mechanisms 14, 15 are operated to lower and lift the respective cleaning arms 12, 13 into abutment against upper and lower surfaces, respectively, of the semiconductor wafer 1. The arm actuating mechanisms 14, 15 also rotate the cleaning arms 12, 13 about their respective axes as indicated by the arrows F to thereby clean the upper and lower surfaces of the semiconductor wafer 1. At this time, the cleaning liquid nozzles 16 eject a cleaning liquid such as ultrapure water to the upper and lower surfaces of the semiconductor wafer 1.

The photosensor 20 has its optical axis aligned with a detecting position capable of detecting the notch 1a formed in the outer circumferential edge of the semiconductor wafer 1 which is being rotated. When the notch 1a is not in the detecting position, the light emitted from the light-emitting element 21 is blocked by the outer circumferential edge of the semiconductor wafer 1. When the notch 1a passes through the detecting position, the light emitted from the light-emitting element 21 travels through the notch 1a to the light-detecting element 22, which converts the detected light into an electric signal that is transmitted to the controller 24. The controller 24 then determines the rotational speed of the semiconductor wafer 1 from the electric signal transmitted from the photosensor 20, and hence detects any rotation failure or rotation abnormality based on the determined rotational speed of the semiconductor wafer 1 and a control signal which is being supplied from the controller 24 to the spindle rotating mechanism 18. In the event that the controller 24 detects a rotation failure or a rotation abnormality, the controller 24 stops the primary cleaning machine 7, issues an alarm, or otherwise performs an appropriate action in response to the rotation failure or the rotation abnormality. In this specification, the rotation failure or the rotation abnormality includes nonrotation of the semiconductor wafer and rotation of the semiconductor wafer at a rotational speed that is higher or lower than a predetermined speed set by the controller 24.

Next, the manner in which a rotation failure or the rotation abnormality is detected will be described in detail by an example.

In the example, the diameter of the semiconductor wafer 1 is 20 mm, and the diameter of the retainer 11a in the portion which engages the outer circumferential edge of the semiconductor wafer 1 is 20 mm. The servomotor in the spindle rotating mechanism 18 has therein a rotary encoder whose resolution has 2048 pulses per one revolution of the retainer 11a. That is, the controller 24 receives the pulse train of 20480 pulses from the rotary encoder when the semiconductor wafer 1 makes one revolution, and generates the pulse train of 20480 pulses for making one revolution of the semiconductor wafer 1.

In this example, a case where rotational accuracy within an error of±1% is required, notwithstanding the rotational speed of the semiconductor wafer 1, will be described.

The controller 24 counts the number of pulses between the time when the photosensor 20 detects the notch 1a twice.

If the number of pulses counted by the controller 24 is not within 20480±1%, then the controller 24 judges that a rotation failure or the rotation abnormality has occurred.

In the primary cleaning machine 7 shown in FIG. 2, only one spindle is driven by the spindle rotating mechanism 18 to rotate the semiconductor wafer under the control of the controller 24. However, any one or more other spindles 11 may be combined with respective spindle rotating mechanisms.

FIGS. 3A and 3B show the secondary cleaning mechanism 8. FIG. 3A illustrates in perspective the secondary cleaning mechanism 8 in its entirety, and FIG. 3B illustrates in cross section a spinning chuck of the secondary cleaning mechanism 8. As shown in FIGS. 3A and 3B, the secondary cleaning mechanism 8 includes a spinning chuck 41 for holding a semiconductor wafer 1 under vacuum and rotating the semiconductor wafer 1 in a horizontal plane at a predetermined rotational speed with a servomotor 47, and a rotatable support 43 supporting on a lower surface thereof a cleaning member 42 made of sponge or the like for cleaning the upper surface of the semiconductor wafer 1 on the spinning chuck 41. The secondary cleaning mechanism 8 further includes a swing arm 44 vertically movable and angularly horizontally movable about a vertical axis located radially outwardly of the spinning chuck 41 and supporting on a radially inner end the support 43, and a cleaning liquid nozzle 45 disposed radially outwardly of the spinning chuck 41 for ejecting a cleaning liquid to the upper surface of the semiconductor wafer 1 on the spinning chuck 41. The support 43 is rotatably supported on the radially inner end of the swing arm 44 by a vertical rotatable shaft 46, and can be rotated at a predetermined speed by an actuating mechanism (not shown) housed in the swing arm 44.

The secondary cleaning machine 8 also has a photosensor 60 positioned radially outwardly of the spinning chuck 41 for detecting the notch 1a formed in the outer circumferential edge of the semiconductor wafer 1. The photosensor 60, which is of the reflective type, comprises a light-emitting element (not shown) for emitting light downwardly to the semiconductor wafer 1 and a light-detecting element (not shown) for detecting light reflected from the semiconductor wafer 1. The servomotor 47 and the photosensor 60 are electrically connected to controller 61.

In the structure shown in FIGS. 3A and 3B, a semiconductor wafer 1 is transferred by a hand of the transfer unit 5A or 5B to a position above the spinning chuck 41, and placed on the spinning chuck 41 in such a state that a surface to be cleaned faces upwardly. Thereafter, the hand of the transfer unit 5A or 5B is retracted away from the secondary cleaning machine 8. Then, the spinning chuck 41 is rotated by the servomotor 47 to rotate the semiconductor wafer 1 at a predetermined speed, and the cleaning liquid nozzle 45 ejects a cleaning liquid to a substantially central region of the upper surface of the semiconductor wafer 1, thereby starting cleaning of the upper surface of the semiconductor wafer 1.

The swing arm 44 is elevated and then angularly horizontally moved to move the support 43 to a position above the substantially central region of the upper surface of the semiconductor wafer 1. Then, the swing arm 44 is lowered to bring the cleaning member 42 into contact with the upper surface of the semiconductor wafer 1. The cleaning member 42 is pressed under a given pressure against the upper surface of the semiconductor wafer 1 which is being rotated by the spinning chuck 41, while at the same time the cleaning member 42 is being rotated independently of the semiconductor wafer 1. The swing arm 44 is angularly moved at a predetermined speed radially to the outer circumferential edge of the semiconductor wafer 1, thus scrubbing the upper surface of the semiconductor wafer 1.

When the swing arm 44 reaches the outer circumferential edge of the semiconductor wafer 1, the swing arm 44 stops its angular movement, and moves upwardly to lift the cleaning member 42 off the upper surface of the semiconductor wafer 1. The elevated swing arm 44 is angularly moved back to the position above the substantially central region of the upper surface of the semiconductor wafer 1. The above cleaning cycle is repeated.

The photosensor 60 has its optical axis aligned with a detecting position capable of detecting the notch 1a formed in the outer circumferential edge of the semiconductor wafer 1. When the notch 1a is not in the detecting position, the light emitted from the light-emitting element is reflected by the outer circumferential edge of the semiconductor wafer 1 and detected by the light-detecting element. When the notch 1a passes through the detecting position, the light emitted from the light-emitting element 21 travels through the notch 1a. Thus, the light is not reflected by the outer circumferential edge of the semiconductor wafer 1, and is not detected by the light-detecting element. The light-detecting element converts the absence of reflected light into an electric signal that is transmitted to the controller 61. The controller 61 then determines the rotational speed of the semiconductor wafer 1 from the electric signal transmitted form the photosensor 60, and hence detects any rotation failure or rotation abnormality based on a determined rotational speed of the semiconductor wafer 1 and a control signal which is being supplied from the controller 61 to the servomotor 47. In the event that the controller 61 detects a rotation failure or a rotation abnormality, the controller 61 stops the secondary cleaning machine 8, issues an alarm, or otherwise performs an appropriate action in response to the rotation failure or the rotation abnormality.

FIG. 4 shows in perspective the tertiary cleaning machine 9 in its entirety. As shown in FIG. 4, the tertiary cleaning machine 9 comprises a spinning chuck 41 for holding a semiconductor wafer 1 under vacuum and rotating the semiconductor wafer 1 in a horizontal plane at a predetermined rotational speed with a servomotor 47, and an angularly movable cleaning liquid nozzle 48 disposed above the spinning chuck 41 for ejecting a cleaning liquid having ultrasonic vibrational energy to the upper surface of the semiconductor wafer 1 on the spinning chuck 41. The spinning chuck 41 and the servomotor 47 are identical to those shown in FIGS. 3A and 3B. The cleaning liquid nozzle 48 is angularly movable over the spinning chuck 41 about a shaft which is positioned preferably radially outwardly of the spinning chuck 41.

The tertiary cleaning machine 9 also has a photosensor 60 positioned radially outwardly of the spinning chuck 41 for detecting the notch 1a formed in the outer circumferential edge of the semiconductor wafer 1. The photosensor 60 is of the reflective type which is the same as the photosensor 60 shown in FIG. 3A. The servomotor 47 and the photosensor 60 are electrically connected to the controller 61.

In the structure shown in FIG. 4, a semiconductor wafer 1 is transferred by a hand of the transfer unit 5A or 5B to a position above the spinning chuck 41, and placed on the spinning chuck 41 in such a state that a surface to be cleaned faces upwardly. Thereafter, the hand of the transfer unit 5A or 5B is retracted away from the tertiary cleaning machine 9. Then, the spinning chuck 41 is rotated by the servomotor 47 to rotate the semiconductor wafer 1 at a predetermined speed, and the cleaning liquid nozzle 48 ejects a cleaning liquid having ultrasonic vibrational energy to the upper surface of the semiconductor wafer 1, thereby cleaning the upper surface of the semiconductor wafer 1 while the cleaning liquid nozzle 48 is being angularly horizontally moved over the semiconductor wafer 1. After the upper surface of the semiconductor wafer 1 has been cleaned, the supply of the cleaning liquid from the cleaning liquid nozzle 48 and the angular movement of the cleaning liquid nozzle 48 over the semiconductor wafer 1 are stopped, and then the spinning chuck 41 is rotated at a higher speed to remove any remaining cleaning liquid on the upper surface of the semiconductor wafer 1 under centrifugal forces. Thus, the upper surface of the semiconductor wafer 1 is dried. In the above cleaning and drying processes, the semiconductor wafer 1 is continuously rotated by the spinning chuck 41.

The photosensor 60 has its optical axis aligned with a detecting position capable of detecting the notch 1a formed in the outer circumferential edge of the semiconductor wafer 1 which is being rotated. When the notch 1a is not in the detecting position, the light emitted from the light-emitting element is reflected by the outer circumferential edge of the semiconductor wafer 1 and detected by the light-detecting element. When the notch 1a passes through the detecting position, the light emitted from the light-emitting element travels through the notch 1a. Thus, the light is not reflected by the outer circumferential edge of the semiconductor wafer 1, and is not detected by the light-detecting element. The light-detecting element converts the absence of reflected light into an electric signal that is transmitted to the controller 61. The controller 61 then determines the rotational speed of the semiconductor wafer 1 from the electric signal transmitted from the photosensor 60, and hence detects any rotation failure or rotation abnormality based on the determined rotational speed of the semiconductor wafer 1 and a control signal which is being supplied from the controller 61 to the servomotor 47. In the event that the controller 61 detects a rotation failure or a rotation abnormality, the controller 61 stops the tertiary cleaning machines 9, issues an alarm, or otherwise performs an appropriate action in response to the rotation failure or the rotation abnormality.

When the drying process is finished, the controller 61 controls stopping of the rotation of the semiconductor wafer 1 at a desired angular position based on the electric signal transmitted from the photosensor 60 and the control signal which is being supplied from the controller 61 to the servomotor 47. Thus, the controller 61 can align the notch 1a in the outer circumferential edge of the semiconductor wafer 1 with a desired direction.

Next, the manner how the notch 1a is aligned with a desired direction will be described in detail by an example.

The servomotor 47 for rotating the semiconductor wafer 1 has an absolute value encoder therein. The controller 61 starts the control of stopping of the rotation of the semiconductor wafer 1. First, the semiconductor wafer 1 continues to rotate until the photosensor 60 detects the notch 1a. When the photosensor 60 detects the notch 1a, the controller 61 receives a detection signal from the photosensor 60 and sets the reading in the encoder housed in the servomotor 47 at the instance of receipt of the detection signal as an origin. Thereafter, the rotation of the semiconductor wafer 1 is stopped by the positional function of the servomotor 47 at a position corresponding to the origin set by the controller 61.

Each of the primary, secondary, and tertiary cleaning machines 7, 8 and 9 has a mechanism for aligning the notch 1a in the outer circumferential edge of the semiconductor wafer 1 with a desired direction. Therefore, the notch 1a may be aligned with a desired direction in the primary and secondary cleaning processes as well as the final cleaning and drying processes. For example, the notch 1a may be aligned with a desired direction at the end of each of the cleaning processes performed respectively by the primary cleaning machine 7, the secondary cleaning machine 8, and the tertiary cleaning machine 9.

The present invention has been described as being applied to a cleaning apparatus incorporated in a polishing apparatus. However, the principles of the present invention may be applied to a cleaning apparatus having a loading/unloading stage and cleaning machines as described above, or such a cleaning apparatus which additionally includes another cleaning machine or machines. The principles of the present invention are also applicable to a semiconductor fabrication process which requires a cleaning process, other than a polishing process.

In the above embodiments, the notch has been described as representing the reference position of a semiconductor wafer. However, the notch may be replaced with an orientation flat, and such an orientation flat may be detected as representing the reference position of a semiconductor wafer. Further, the present invention is also applicable to a glass substrate, a liquid crystal panel, and so on.

The present invention offers the following advantages:
1) Since the cleaning apparatus has a function to align the reference position of a semiconductor wafer with a desired direction, a discrete device for achieving such positional alignment of the semiconductor wafer can be dispensed with.
2) In an apparatus which has a cleaning apparatus and a wafer cassette for containing semiconductor wafers and performs various processes therein, it is possible to align the reference positions of the semiconductor wafers which have been processed with one direction within the wafer cassette without changing the size of the apparatus.
3) Any rotation failure or rotation abnormality of semiconductor wafers being cleaned and dried can be detected.

Although certain preferred embodiments of the present invention have been shown and described in detail, it should be understood that various changes and modifications may be made therein without departing from the scope of the appended claims.

What is claimed is:

1. A polishing apparatus for polishing a workpiece, said apparatus comprising a polishing section for a surface of the workpiece, and a cleaning apparatus for cleaning the thus polished surface of the workpiece, said cleaning apparatus comprising:
    a rotating mechanism for rotating the workpiece;
    a sensor for detecting a reference position of the workpiece; and
    a controller for determining a rotational speed of the workpiece as a function of an output signal from said sensor.

2. An apparatus as claimed in claim 1, wherein the workpiece is a semiconductor wafer, and said rotating mechanism is constructed to support and rotate the semiconductor wafer about a rotation axis.

3. An apparatus as claimed in claim 1, wherein the reference position of the workpiece is an orientation flat or a notch formed in an outer circumferential edge of the workpiece, and said sensor is operable to detect the grientation flat or notch.

4. An apparatus as claimed in claim 1, wherein said sensor comprises a transmissive photo sensor.

5. An apparatus as claimed in claim 1, wherein said sensor comprises a reflective photo sensor.

6. An apparatus as claimed in claim 1, wherein said controller is operatively coupled to said rotating mechanism to control operation thereof to align the reference position of the workpiece at a predetermined position relative to a rotation axis of said rotating mechanism.

7. An apparatus as claimed in claim 1, herein said controller is operable to determine the occurrence of a rotation failure or a rotation abnormality based on the determined rotational speed of the workpiece.

8. An apparatus as claimed in claim 7, wherein said controller is operable to perform an action in response to the determination of a rotation failure or a rotation abnormality.

9. An apparatus as claimed in claim 8, wherein said controller is operatively coupled to said rotating mechanism to control operation thereof, and said action comprises stopping rotation of said rotating mechanism.

10. An apparatus as claimed in claim 8, wherein said action comprises issuing an alarm.

11. An apparatus for processing a workpiece, comprising:
a rotating mechanism of a cleaning operation or drying operation for rotating the workpiece such that one of the cleaning operation and the drying operation is performed on the workpiece while the workpiece is being rotated by said rotating mechanism;
a sensor for detecting a reference position of the workpiece being rotated by said rotating mechanism and providing an Output signal; and
a controller communicating with said sensor, said controller being operable to determine a rotational speed of the workpiece as a function of the output signal from said sensor.

12. An apparatus as claimed in claim 11, wherein the workpiece is a semiconductor wafer, and said rotating mechanism is constructed to support and rotate the semiconductor wafer about a rotation axis.

13. An apparatus as claimed in claim 11, wherein the reference position of the workpiece is an orientation flat or a notch formed in an outer circumferential edge of the workpiece, and said sensor is operable to detect the orientation flat or notch.

14. An apparatus as claimed in claim 11, wherein said sensor comprises a transmissive photosensor.

15. An apparatus as claimed in claim 11, wherein said sensor comprises a reflective photo sensor.

16. An apparatus as claimed in claim 11, wherein said controller is operatively coupled to said rotating mechanism to control operation thereof to align the reference position of the workpiece at a predetermined position relative to a rotation axis of said rotating mechanism.

17. An apparatus as claimed in claim 11, wherein said controller is operable to determine the occurrence of a rotation failure or a rotation abnormality based on the determined rotational speed of the workpiece.

18. An apparatus as claimed in claim 17, wherein said controller is operable to perform an action in response to the determination of a rotation failure or a rotation abnormality.

19. An apparatus as claimed in claim 18, wherein said controller is operatively coupled to said rotating mechanism to control operation thereof, and said action comprises stopping rotation of said rotating mechanism.

20. An apparatus as claimed in claim 18, wherein said action comprises issuing an alarm.

21. An apparatus for rotating a workpiece having in an outer circumferential edge thereof an orientation flat or a notch, during which rotation the workpiece may be subjected to at least one of a cleaning operation, including supplying a cleaning liquid to the workpiece during rotation thereof, and a drying operation, including rotating the workpiece at a high speed, said apparatus comprising:
a rotating mechanism for rotating the workpiece;
a sensor for detecting a reference position of the workpiece represented by the orientation flat or a notch therein; and
a controller operatively connected to said rotating mechanism for controlling operation thereof as a function of an output signal from said sensor to:
rotate said rotating mechanism and thereby the workpiece during an operation of cleaning the workpiece;
rotate said rotating mechanism and thereby the workpiece at a high speed during an operation of drying the workpiece; and
stop rotation of said rotating mechanism to align the reference position of the workpiece at a predetermined position relative to a rotation axis of said rotating mechanism at the completion of at least one of the cleaning operation and the drying operation.

22. An apparatus as claimed in claim 21, wherein the workpiece is a semiconductor wafer, and said rotating mechanism is constructed to support and rotate the semiconductor wafer about said rotation axis.

23. An apparatus as claimed in claim 21, wherein said sensor comprises a transmissive photo sensor.

24. An apparatus as claimed in claim 21, wherein said sensor comprises a reflective photosensor.

25. An apparatus as claimed in claim 21, wherein said controller is operable to determine the occurrence of a rotation failure or a rotation abnormality.

26. An apparatus as claimed in claim 25, wherein said controller is operable to perform an action in response to the determination of a rotation failure or a rotation abnormality.

27. An apparatus as claimed in claim 26, wherein said controller is operable to stop rotation of said rotating mechanism.

28. An apparatus as claimed in claim 26, wherein said action comprises issuing an alarm.

29. A polishing apparatus for polishing a workpiece having in an outer circumferential edge thereof an orientation flat or a notch, said apparatus comprising a polishing section for polishing a surface of the workpiece, and a cleaning apparatus for performing at least one of an operation of cleaning the thus polished surface of the workpiece and an operation of drying the thus clean polished workpiece, said cleaning apparatus comprising:
a rotating mechanism for rotating the workpiece;
a sensor for detecting a reference position of the workpiece represented by the orientation flat or a notch therein; and
a controller operatively connected to said rotating mechanism for controlling operation thereof as a function of an output signal from said sensor to:
rotate said rotating mechanism and thereby the workpiece during an operation of cleaning the workpiece;
rotate said rotating mechanism and thereby the workpiece at a high speed during an operation of drying the workpiece; and
stop rotation of said rotating mechanism to align the reference position of the workpiece at a predetermined position relative to a rotation axis of said rotating mechanism at the completion of at least one of the cleaning operation and the drying operation.

30. An apparatus as claimed in claim 29, wherein the workpiece is a semiconductor wafer.

31. An apparatus as claimed in claim 29, wherein said sensor comprises a transmissive photosensor.

32. An apparatus as claimed in claim 29, wherein said sensor comprises a reflective photosensor.

33. An apparatus as claimed in claim 29, wherein said controller is operable to determine the occurrence of a rotation failure or a rotation abnormality.

34. An apparatus as claimed in claim 33, wherein said controller is operable to perform an action in response to the determination of a rotation failure or a rotation abnormality.

35. An apparatus as claimed in claim 34, wherein said controller is operable to stop rotation of said rotating mechanism.

36. An apparatus as claimed in claim 34, wherein said action comprises issuing an alarm.

* * * * *

UNITED STATES PATENT AND TRADEMARK OFFICE
CERTIFICATE OF CORRECTION

PATENT NO. : 6,439,962 B1
DATED : August 27, 2002
INVENTOR(S) : Koji Ato

It is certified that error appears in the above-identified patent and that said Letters Patent is hereby corrected as shown below:

Column 10,
Lines 50-51, change "grientation" to -- orientation --.
Line 61, change "herein" to -- wherein --.

Column 11,
Line 36, change claim 17 to read
-- An apparatus for rotating a workpiece, during which rotation a processing operation may be performed on the workpiece, said apparatus comprising:
  a rotating mechanism for rotating the workpiece;
  a sensor for detecing a reference position of the workpiece rotated by said rotating mechanism and providing an output signal; and
  a controller communicating with said sensor, said controller being operable to determine a rotational speed of the workpiece as a function of the output signal from said sensor and being operable to determine the occurrence of a rotation failure or a rotation abnormality based on the determine rotational speed of the workpiece. --

Column 12,
Line 50, change "wafer." to -- wafer, and said rotating mechanism is constructed to support and rotate the semiconductor wafer about said rotation axis. --

Signed and Sealed this

Eighteenth Day of January, 2005

JON W. DUDAS
*Director of the United States Patent and Trademark Office*